(12) United States Patent
Callahan

(10) Patent No.: US 7,069,482 B1
(45) Date of Patent: Jun. 27, 2006

(54) ROM ERROR-CORRECTION CONTROL

(75) Inventor: John M. Callahan, San Ramon, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 798 days.

(21) Appl. No.: 09/642,858

(22) Filed: Aug. 21, 2000

(51) Int. Cl.
*G11C 29/00* (2006.01)

(52) U.S. Cl. ...................................... 714/710; 714/718
(58) Field of Classification Search ................. 375/51; 714/753, 710, 711, 718, 733; 365/200
See application file for complete search history.

(56) References Cited

U.S. PATENT DOCUMENTS

| | | | | | |
|---|---|---|---|---|---|
| 4,689,792 A | * | 8/1987 | Traynor | ...................... | 714/753 |
| 4,984,054 A | * | 1/1991 | Yamada et al. | ............... | 375/51 |
| 5,920,512 A | * | 7/1999 | Larsen | ....................... | 365/200 |
| 5,986,952 A | * | 11/1999 | McConnell et al. | ........ | 365/200 |
| 6,219,286 B1 | * | 4/2001 | Fuchigami et al. | ......... | 365/200 |

* cited by examiner

*Primary Examiner*—David Ton
(74) *Attorney, Agent, or Firm*—Patrick T. King (57) ABSTRACT

To determine the occurrence of an address for a defective memory, cell in a ROM, an error-correction control system includes a comparator that compares a set of incoming memory address signals with static signals provided by a laser-fuse array. The static signals represent addresses of defective memory cells in the ROM. An ADDHIT signal indicates that the ROM has received an address of a defective memory cell. The ADDHIT signal is then timed to provide a REV signal that changes the polarity of the memory bit signal out of a buffer circuit. This corrects an erroneous memory cell by reversing the sense of the memory bit received from a defective memory cell and delivered to an output terminal of the ROM. The REV signal is steered to an output buffer corresponding to the proper ROM chip output pad using a fuse-controlled selection circuit. A plurality of defective memory cells are corrected by using a number of comparators to compare input address signals to a number of fuse-controlled static addresses, each representing a defective memory cell.

19 Claims, 12 Drawing Sheets

ROM ERROR-CORRECTION CONTROL

BACKGROUND OF THE INVENTION

1. Field of the Invention

This invention relates to error correction for a Read Only Memory (ROM).

2. Prior Art

A large percentage of the defects that cause bit errors in a semiconductor memory are random local defects in individual memory cells rather than global defects that totally wipe out a row or column of memory cells. The ease of correcting defective memory cells depends on the type of memory, that is, whether the memory is a ROM or a RAM. RAMS chips can have defective rows or columns replaced in the testing stages subsequent to fabrication of such chips. RAMs can be built with redundant columns and rows that can be substituted for defective rows and columns by the blowing fuses with a laser beam.

In the case of a ROM, it has been historically, difficult to correct errors after the ROM has been fabricated and is in a testing stage. In a ROM, information is permanently programmed into the ROM cells during initial fabrication so that replacement of all of the cells in a column or row of a ROM die also requires replacement of the specific information stored in each of the ROM memory cells. It would be prohibitively expensive to duplicate all of the specific information fabricated into a ROM cell by blowing a number of fuses for each cell of a defective ROM column or row. For example, in a 4 Meg ROM that has 2048 rows and 2048 columns, replacement of a defective column would require providing 2048 fuses and blowing an average of 1024 fuses. Consequently, using fuses for recovery of defective cells in a ROM die has been thought to be uneconomical.

Other techniques can be used for correcting defective memory bits in a ROM. One such technique is to use a Hamming code for encoding all of the information in a column or row in order. This technique provides data information recovery as well as a certain amount of error, detection and correction capability for each row or column. However, except for special applications where cost in no object, this type of error coding is uneconomical because the area of the ROM chip increases by as much as 30% to accommodate extra bits required by this type of error coding. So for most types of ROM chips, error detection and correction techniques are not used and chip manufacturers simply accept losses in chip yield due to memory cell defects.

Consequently, a need exists for an economic, effective technique for correction of defective bits in a ROM that greatly reduces the number of fuses required to be blown for correction of a defective ROM bit.

SUMMARY OF THE INVENTION

It is therefore an object of the invention to provide an economic, effective technique for correction of defective bits in a ROM to greatly reduces the number of fuses required to be blown for correction of a defective bit in the ROM.

In accordance with this and other objects of the invention, a fuse-controlled error-correction control system and method for a ROM are provided according to the invention. The system includes a defective memory-cell address detector circuit (CMP) that compares input address signals for the ROM to a fuse-controlled preset static address of a predetermined defective memory cell of the ROM. The address detector provides an address-hit output signal (ADDHIT) that indicates the occurrence of input address signals corresponding to said fuse-controlled preset static address for the predetermined defective memory cell. An (AOUT) circuit receives the address-hit output signal ADDHIT signal and provides a corresponding bit-reversal output signal (REV). A data output buffer receives data bits from memory cells of the ROM, including a bit from the predetermined defective memory cell. The data output buffer has an output terminal coupled to a data output terminal of the ROM. The data output buffer also has an output-reversal control terminal for receiving the bit-reversal output signal REV, which reverses the sense of the data signal corresponding to the predetermined defective memory cell at the output terminal of the data output buffer when the address of the defective memory cell is detected by the defective memory-cell address detector circuit CMP.

The defective memory cell address detector circuit CMP further includes a comparator circuit that compares each bit of a multi-bit memory address signal to respective fuse-controlled static bits in an array of fused circuits that statically represent an address of the predetermined defective memory cell. The comparator circuit also uses exclusive logic (ADDXNOR) to compare individual bits of the multi-bit memory address signals to respective fuse-controlled static bits that represent an address of a defective memory cell. The fuse-controlled static bits for the address of the defective memory cell are provided by an array of fuses that are adapted to be blown by a laser beam.

The ROM includes a plurality of data output buffers. The AOUT circuit receives the address-hit output signal ADDHIT signal and provides a corresponding bit-reversal output signal (REV). The AOUT circuit has a fuse-controlled error-correction control system for selecting a particular one of the plurality of data output buffers, corresponding to the output terminal for the defective memory cell.

A detector circuit is provided for recognizing an all 1's input address signal as an address for a defective memory cell.

For detecting each additional defective memory cell, additional memory cell address detector circuits are provided that compare the input address signals to the ROM to another fuse-controlled preset static to provide additional corresponding address-hit output signal (ADDHIT), which indicates the occurrence input address signals for the additional predetermined defective memory cell.

The method of controlling error-correction for a ROM includes the steps of: comparing input address signals for the ROM to a fuse-controlled preset static address of a predetermined defective memory cell of the ROM; providing an address-hit output signal (ADDHIT), which indicates the occurrence of input address signals corresponding to said fuse-controlled preset static address of said predetermined defective memory cell; providing a corresponding bit-reversal output signal (REV) in response to the address-hit output signal ADDHIT; and, in response to the bit-reversal output signal (REV), reversing the sense of the data signal corresponding to the predetermined defective memory cell at the output terminal of a data output buffer when the address of the defective memory cell is detected by the defective memory-cell address detector circuit CMP.

The step of comparing input address signals for the ROM to a fuse-controlled preset static address of a predetermined defective memory cell of the ROM further includes comparing each bit of a multi-bit memory address signal to respective fuse-controlled static bits in an array of fused circuits that statically represent an address of the predetermined defective memory cell. The step of comparing includes using exclusive logic (ADDXNOR) to compare individual bits of the multi-bit memory address signals to respective fuse-controlled static bits that represent an address of a defective memory cell. The step of comparing includes providing the fuse-controlled static bits for the address for the defective memory cell with an array of fuses that are adapted to be blown by a laser beam. The method includes providing a plurality of data output buffers; selecting a particular one of said plurality of data output buffers for receiving the address-hit output signal ADDHIT signal that provides a corresponding bit-reversal output signal (REV); and controlling said selection with a fuse-controlled error-correction control system. The method includes recognizing an all, 1's input address signal as an address for a defective memory cell.

For additional defective memory cells, the method includes comparing input address signals for the ROM to additional fuse-controlled preset static address of an other predetermined defective memory cell of the ROM and providing an other address-hit output signal, (ADDHIT), which indicates the occurrence of the other input address signals corresponding to said fuse-controlled preset static address of said other predetermined defective memory cell.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENT

Reference is now made in detail to a preferred embodiment of the invention, an example of which is illustrated in the accompanying drawings. While the invention is described in conjunction with the preferred embodiment, it will be understood that the invention is not limited to this embodiment. On the contrary, the invention is intended to cover any alternatives, modifications and equivalents, which may be included within the spirit and scope of the invention as defined by the appended claims.

An exemplary 4 Mbit ROM chip is used to illustrate the invention that includes logic circuits and other circuitry to correct up to 9 defective bits in the ROM. The defective bits can occur either as a defect cluster of 9 defective bits or as 9 randomly located defective bits. The 4 Mbit ROM is addressed by 19 memory address lines and has 8 output pins.

Figure 1A:
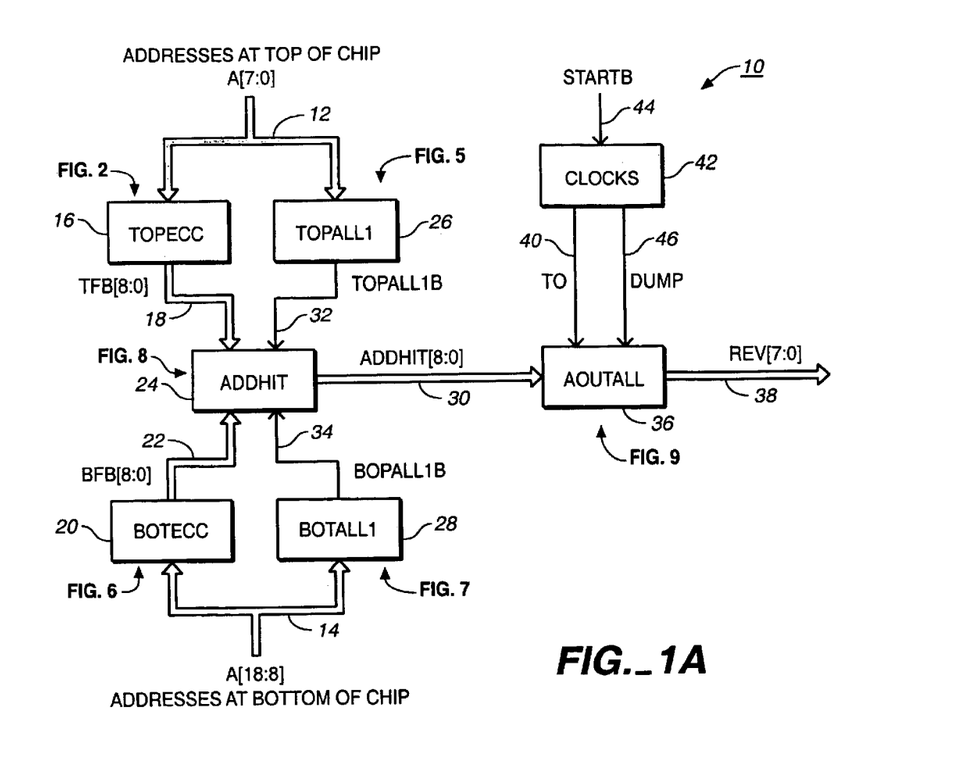
FIG. 1A is a top level block diagram illustrating a ROM error control correction system according to the invention.
Figure 1B:
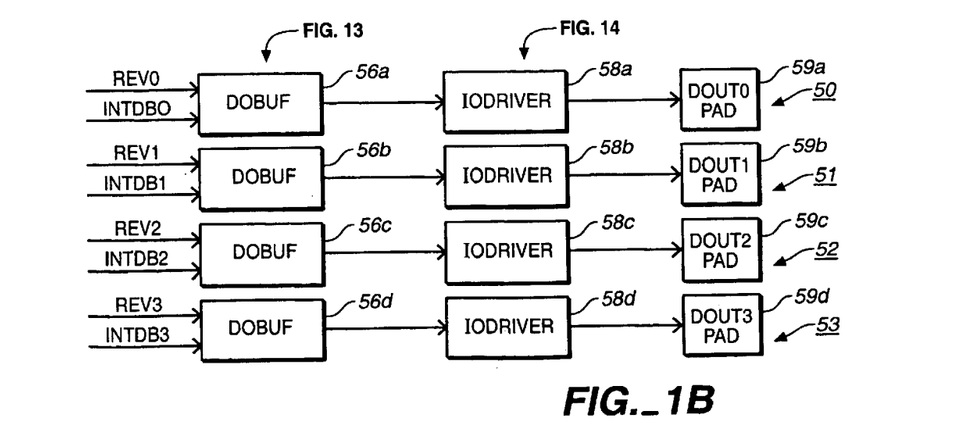
FIG. 1B is a block diagram illustrating four of eight output amplifier chains, each of which has the capability of reversing the sense of a defective memory bit prior to driving one of the eight output pads of a ROM chip.

FIG. 1A and FIG. 1B illustrate top level elements of a ROM error control correction system according to the present invention. FIG. 1A illustrate an address detection and control system 10. FIG. 1B illustrates four of eight ROM-chip output amplifier chains that have the capability of reversing the sense of an output bit from a predetermined defective ROM cell when such a defective ROM cell is addressed by incoming address signals.

FIG. 1A is a top level block diagram that illustrates the address detection and control system 10 for a ROM chip that has two groups of address lines. Due to the physical layout of the exemplary ROM chip, the nineteen address lines are conveniently broken into two groups, a top group of eight address lines and a bottom group of eleven address lines. The system of FIG. 1A provides for correction of up to nine defective ROM cells. It is noted that various other numbers of defective ROM cells can be accommodated by appropriate implementation of the elements of the system described herein.

As shown in FIG. 1A, eight address lines A[7:0] for the top group are provided in a top address bus 12 at the top of the chip. Eleven address lines B[8:18] for the bottom group are provided in a bottom address bus 14 at the bottom of the chip.

A top address comparison TOPECC circuit 16 bit-by-bit compares all of the bits of the address signals on the top set of eight memory address lines to each of the corresponding bits of a number of up to nine laser-fuse programmed code words that correspond to the top address bits for up to nine defective memory cells. The present embodiment of the invention provides for nine code words, each providing for identification of up to nine defective memory cells. Each of the nine code words for the address bits of a respective defective memory cell are provided by blowing various fuses in the top address comparison TOPECC circuit 16. If the eight address signals of the top group all match a laser blown code in the cell TOPECCC circuit, a corresponding one of nine top output signals TFB[8:0] on an output bus.18 goes low. In the present description of the invention, a high signal level and a signal level are synonymous; and a low level and a 0 (zero) signal level are synonymous.

In a similar manner, a bottom address comparison BOTECC circuit 20 compares all of the address signals on the bottom set of eleven memory address lines to nine code words that correspond to the bottom address bits, for predetermined defective memory cells. The code words for the bottom addresses of the defective bits are provided by blowing various fuses in the bottom address comparison BOTECC circuit 20. If the eleven address signals of the bottom group all match the laser blown code in the cell BOTECC circuit 20, one of nine bottom output signals BFB[8:0] on an output bus 22 goes low.

Both the TFB[8:0] bus and the BFB[8:0] bus are connected to input terminals of an ADDHIT circuit 24. The ADDHIT circuit 24 combines one of the TFB[8:0] signals from the TOPECC circuit 16 with a corresponding one of the BFB[8: 0] signals from the BOTECC circuit 20 to provide a corresponding one of nine address hit signals ADDHIT [8:0] for a predetermined defective ROM bit. If the 8 top addresses match a laser blown code in the cell TOPECC 16, one of the TFB [8:0] signals goes low. Also, if the addresses at the bottom of the chip match the rest of the laser blown code in cell BOTECC 20, one of the BFB [8:0] signals goes low. If a particular TFB[8:0] signal matches up with its associated BFB[8:0] signal, one of the ADDHIT [8:0] output signal lines in a bus 30 goes high or active.

A TOPALL1 circuit 26 and a BOPALL1 circuit 28 are provided for one special case that is when all of the input address bits are 1's. If no laser fuses are blown, the. TOPECC circuit 16 and the BOPECC circuit 18 will call out a match when the input addresses are, all ones. In that case, TFB[8:0] and its associated BFB[8:0] signal both go low. The cell ADDHIT needs to have information about whether the ADDHIT signal is to go active for the all ones case. The TOPALL1 circuit 26 and the BOPALL1 circuit 28 both go low for an all ones input address signal. Inside cell ADDHIT is a fuse that indicates whether or not the all ones case is to be considered as a defective address or not. If that fuse is not blown, the output signals TOPALL1B on a signal line 32 and a BOTALL1B on a signal line 34 are to be ignored by the ADDHIT circuit 24.

The ADDHIT[8:0] signals corresponding to nine defective memory cells are provided to input terminals of an AOUTALL circuit 36. The AOUTALL circuit 36 exclusively provides one of eight reversing signals REV[7:0] on a control signal bus 38. The REV[7:0] signals are then used in the circuits of FIG. 1B to reverse the output polarity of an output signal for a particular defective ROM cell. Each of the REV[7:0] signals is provided by an AOUT circuit that uses three fuses in the AOUT cell to determine which of the REV[7:0] signals is to be activated, to reverse the output data signal for a defective ROM address, as illustrated in connection with FIGS. 9 and 10, described herein below.

Figure 15:
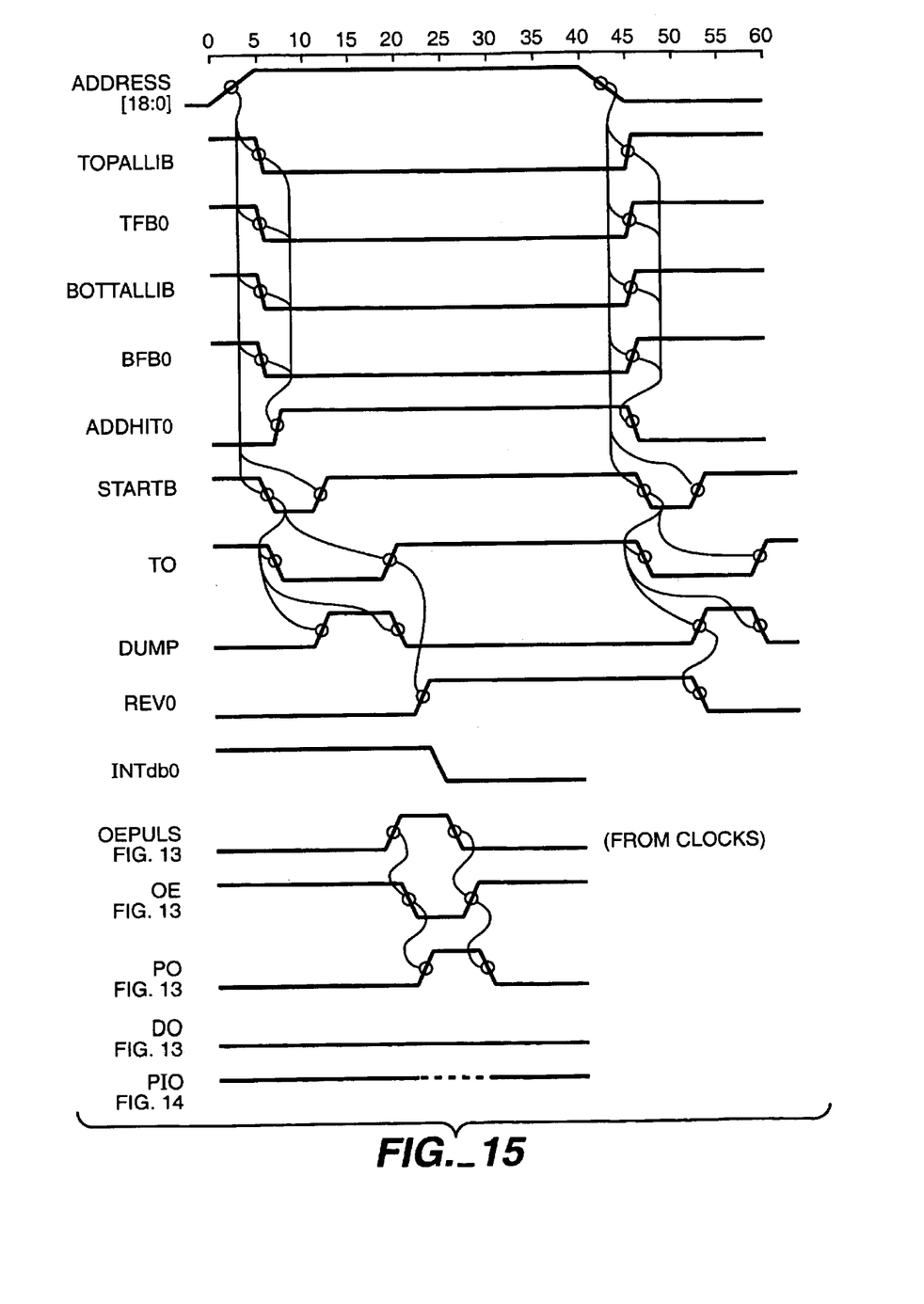
FIG. 15 is a timing diagram for various signals in the ROM error control correction system of FIGS. 1A and 1B and for various clock and data signals of FIGS. 13 and 14.

When a defective address is detected, the AOUTALL cell 36 takes the corresponding ADDHIT[8:0] signal and creates a corresponding one of the REV[7:0] signals on the rising edge of a signal TO. TO is received on a signal line 40 from a CLOCKS circuit 42. The CLOCKS circuit 42 creates various timing clock signals for operation of a ROM chip and for the ROM error correction system according to the invention. This is done by using a STARTB signal on an input signal line 44 that is created by delaying and combining all of the signals derived from edge detector for the address input signals, as illustrated in FIG. 15 herein below. The signal TO is slightly delayed to prevent one of the REV[7:0] signals from going high until an information signal INTDB from a defective cell is established. This prevents a chip output signal on a ROM output pin from switching levels unnecessarily.

The CLOCKS circuit 42 also provides a DUMP signal on a signal line 46. The DUMP signal remove a previously active one of the REV[7:0] signals that is held in the AOUTALL circuit 36 from a previous memory operation cycle.

FIG. 1B shows four of eight output amplifier chains 50, 51, 52, 53, for driving eight output pads of the ROM chip. Each of the output amplifier chains includes a data output buffer DOBUF, circuit, respectively shown, as 56a, 56b, 56c, 56d, that drives a respective IODRIVER circuit 58a, 58b, 58c, 58d. Output terminals of the respective IODRIVER circuits are connected to respective data output DOUT[7:0] PADS 59a, 59b, 59c, 59d of the ROM chip.

Each of the data output buffer DOBUF circuits receives a respective one of the REV[7:0] signals. Each of the data output buffer circuit's also receives a respective one of information data bits INTDB[7:0] that represents an information bit stored in an addressed memory cell after being amplified by a senseamp.

If the received one of the INTDB[7:0] signals is from a memory cell having a defective address, the INTDB information is wrong. To correct this, the defective information data bit is reversed to make a 0 into a 1 and a, 1 into a 0. The respective one of the REV[7:0] signals is used to reverse the defective data bit by having a corresponding one of the DOBUF circuits invert the respective INTB signal to provide a correct data bit at a corresponding one of the data output DOUT[7:0] PADS.

As previously mentioned, due to design preferences or to design requirements that control the physical layout of the exemplary ROM chip, the nineteen address lines of the exemplary ROM are divided into two groups, a top group of eight address lines and a bottom group of eleven address lines. This division of address lines into two groups is optional and the invention is intended to cover a single grouped set of the ROM address signals or more than one grouped sets of address lines, as described in the particular embodiment of the invention described herein. The embodiment of the invention described herein includes two groups of address lines: a top group and a bottom group. For the top group, eight address lines A[7:0] are provided on the bus 12 at the top of the chip. For the bottom group, eleven address lines A[8:18] are provided on the bus 14 at the bottom of the chip.

Figure 2:
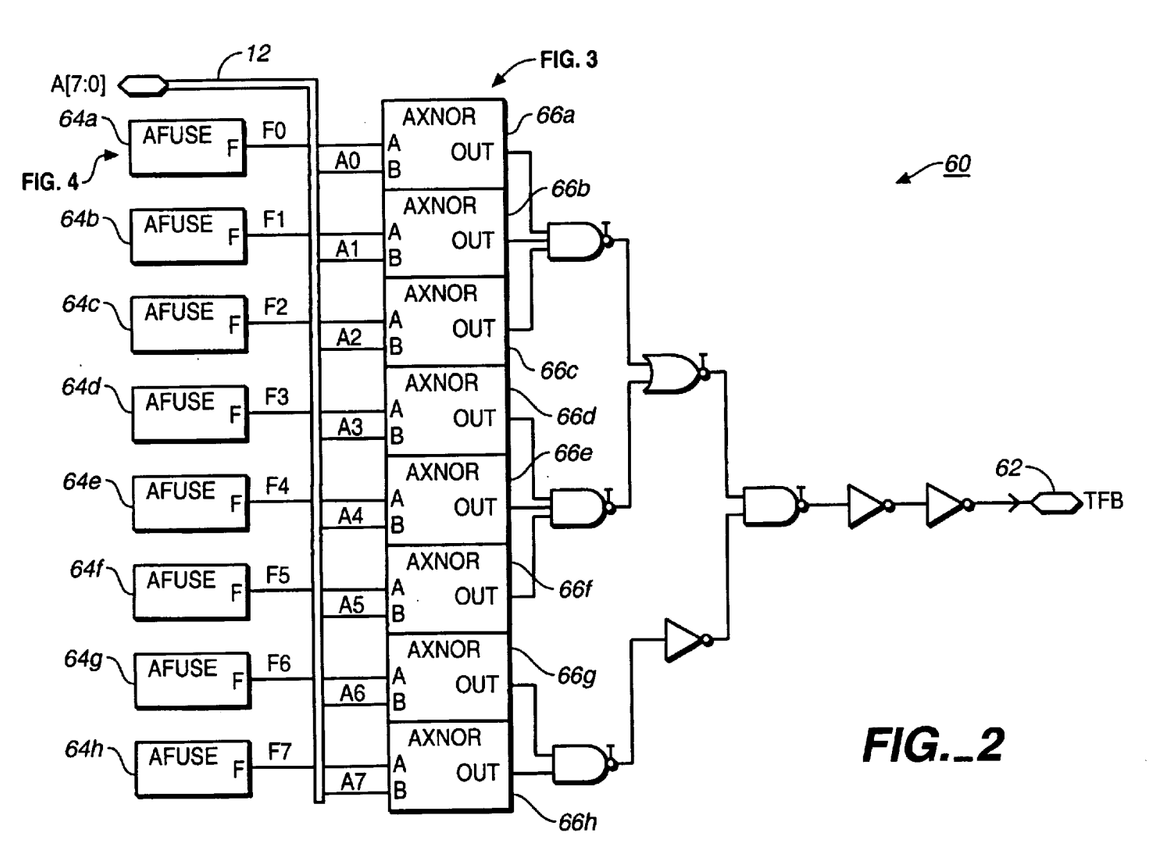
FIG. 2 is a block diagram of an top address comparison ATOPCMP circuit that compares address signals for a top set of memory address lines to a corresponding set of laser-programmed static address bits for a predetermined defective memory cell.

FIG. 2 illustrates an exemplary top address comparison ATOPCMP circuit 60 that compares the top set of address signals A[7:0] to a code word corresponding to the top address bits for a predetermined defective memory cell. In the embodiment of the invention being presented, correction of bit errors in nine defective memory cells can be accommodated. This requires nine separate ATOPCMP circuits 60 for detection of the specific incoming addresses for all nine of the defective memory cells. The nine top address comparison ATOPCMP circuits 60 are then used in the top address comparison TOPECC circuit 16 of FIG. 1A. Each of the nine ATOPCMP circuits has an output terminal TFB 62 at which, is provided a particular one of the nine TFB[8:0] signals that is connected to one of nine signal lines on the bus 18 of FIG. 1A. A TFB signal is activated when all eight of the top address bits for a defective memory cell match a static 8-bit code word provided by fuses that are blown, for example, with a laser beam.

The code word that identifies the top addresses of a particular defective memory cell in the ROM is provided by eight fuse cells circuits AFUSE 64a–64h. The fuses in each of the fuse cell circuits are blown with a laser beam to provide the corresponding static output code-word signals F0–F7.

The eight respective top address signals A[7:0] are provided on the bus 12 to respective B input terminals of eight AXNOR circuits 66a–66h. Each of the eight static output code-word signals F0–F7 are provided to the A input terminals of a respective one of eight AXNOR circuits 66a–66h.

Figure 3:
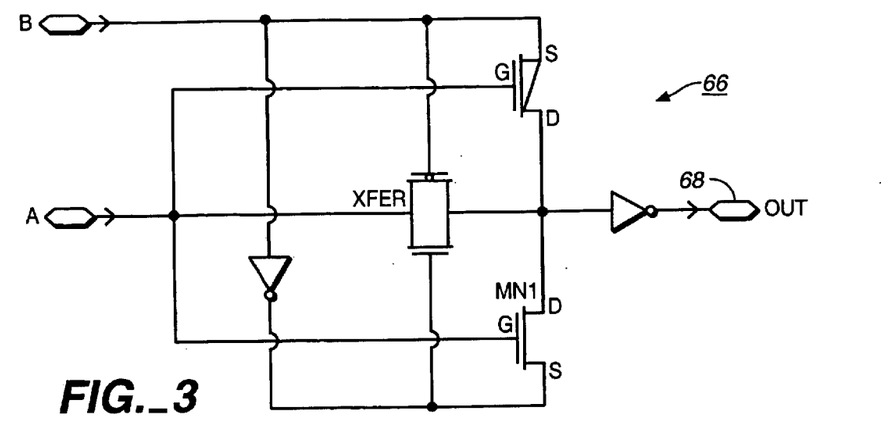
FIG. 3 is a circuit diagram of a typical AXNOR circuit used in the address comparison circuit of FIG. 2 for comparing each static address bit to one bit address signal.

FIG. 3 illustrates a typical EXCLUSIVE NOR AXNOR circuit 66, eight of which are used in the address comparison circuit 60 of FIG. 2. The AXNOR circuit 66 provides a 1 output at an output terminal OUT 68 if the input signals on input terminals A and B are the same, that is, if both inputs are both 1's or both 0's.

With reference to back to FIG. 2, the signals from the OUT terminals of the AXNOR circuit 66a–66h are combined with logic circuit, elements to provide a particular one of the TFB [8:0] signals at terminal 62. If the eight address signals A[7:0]of the top group all match a laser-blown code word provided by the AFUSE circuits 64a–64h, the particular one of the TFB[8:0] signals at terminal 62 goes low, or to a 0 level.

Figure 4:
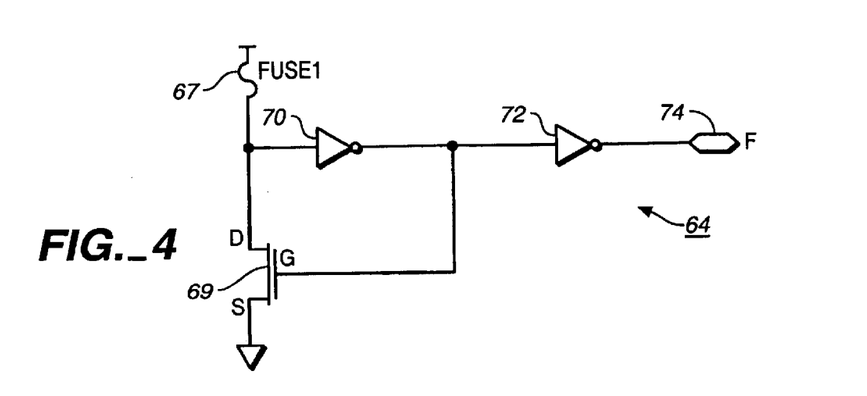
FIG. 4 is circuit diagram of a typical FUSE circuit used in the address comparison circuit of FIG. 2 and FIG. 2.

FIG. 4 illustrates a circuit diagram of a typical fuse circuit AFUSE 64 used in the address comparison circuit of FIG. 2 and elsewhere as required herein below. A fuse element 67 is connected between a positive voltage source and a drain terminal of a pull down transistor 69 that has its source connected to a ground terminal. The drain terminal is connected to an input terminal of an inverter 70 that has its output terminal connected to a gate terminal of the pull-down transistor 69 and through another inverter to a fuse output terminal 74. Typically, the fuse element 67 is blown by a laser beam so that the F signal at terminal 74 is low. Eight of these circuits 64 are used to provide the static fuse signals F0–F7 in FIG. 2.

Figure 5:
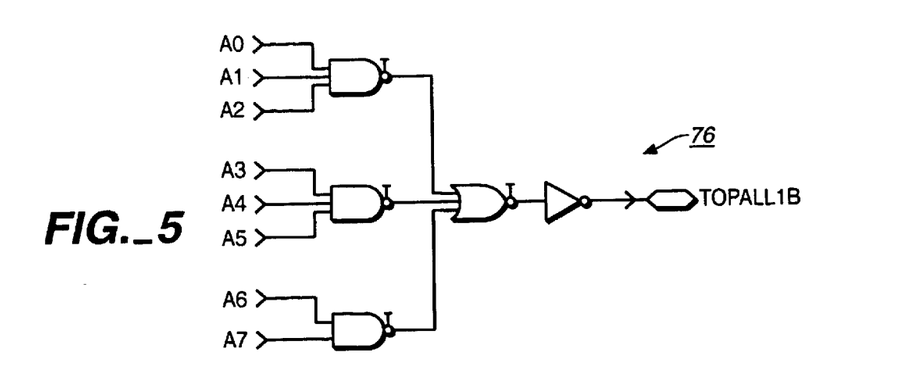
FIG. 5 is a circuit diagram of a TOPALL1 circuit that detects an all 1's address signal for the top set of memory address lines.

FIG. 5 illustrates a TOPALL1 logic circuit 76 that detects an all 1's address signal for the top set of memory address lines A[7:0] and that provides a TOPALL1B output signal.

Figure 6:
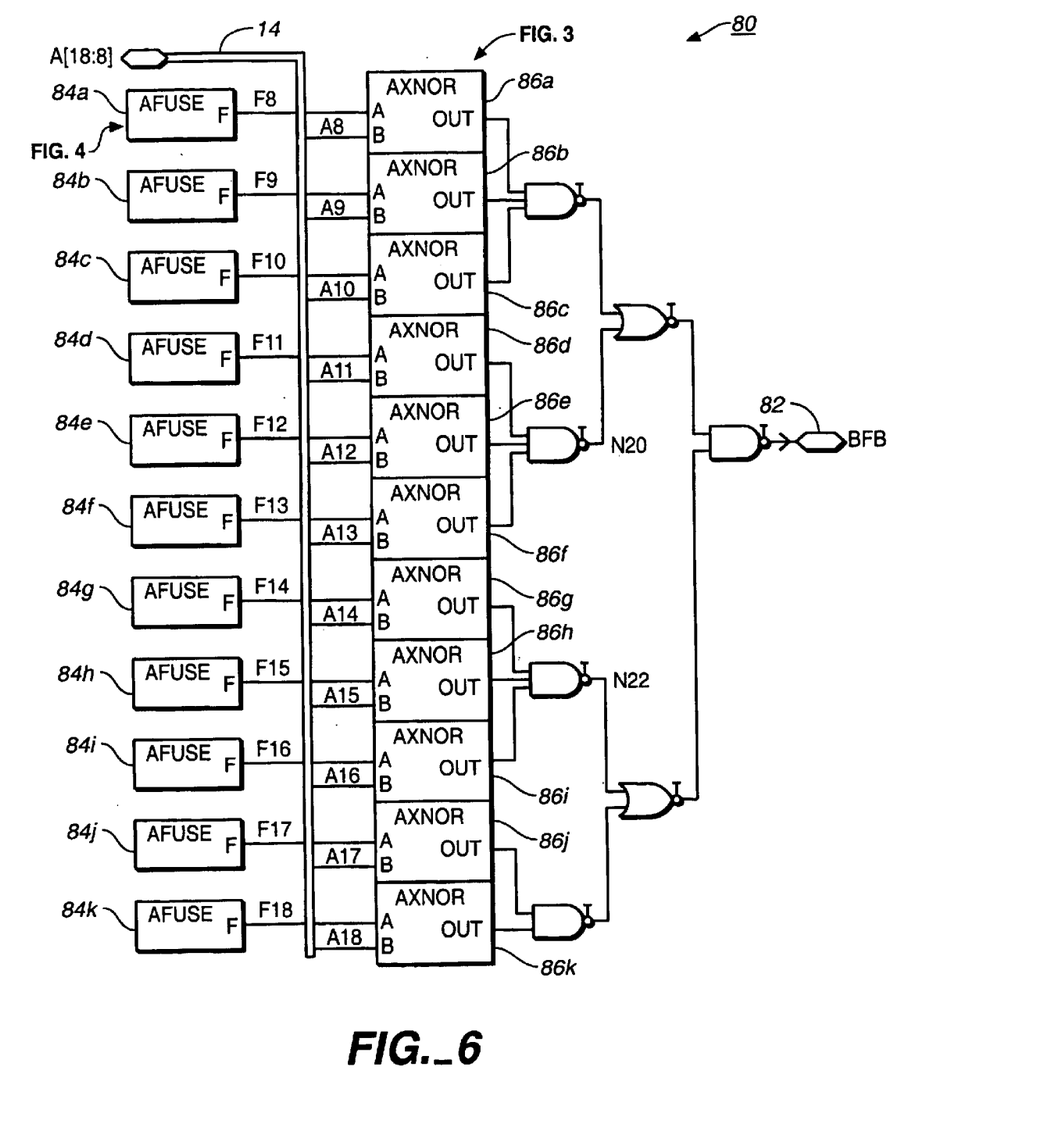
FIG. 6 is a block diagram of a bottom address comparison ABOTCMP circuit that compares address signals for a bottom set of memory address lines to a corresponding set of laser-programmed static address bits for a predetermined defective memory cell.

FIG. 6 illustrates an exemplary bottom address comparison ABOTCMP circuit 80 that is similar to the ATOPCMP circuit 60 of FIG. 2. The bottom address comparison ABOTCMP circuit 80 compares the bottom set of address signals A[18:8] to a static code word corresponding to the bottom address bits for a predetermined defective memory cell. To accommodate the nine defective memory cells, nine separate ABOTCMP circuits 60 are required for detection of each of the incoming bottom addresses for the nine defective memory cells. Each of the nine BOTECC circuits provides a particular one of the nine BFB[8:0] signals at an output terminal 82 that is connected to one of nine signal lines in the bus 22 of FIG. 1A.

The code word that identifies the bottom addresses of a particular defective memory cell in the ROM is provided by eleven fuse cells circuits AFUSE 84a–84k. The fuses in each of the fuse cell circuits are blown with a laser beam to provide the corresponding static output code-word signals F8–F18.

Eleven respective bottom address signals A[18:8] are provided on the bus 14 to respective B input terminals of eleven AXNOR circuits 86a–86k. Each of the eleven static output code-word signals F8–F18 are provided to the A input terminal of a respective one of eleven AXNOR circuits 86a–86k, which are similar to the AXNOR circuits 66a–66h of FIG. 2. The AFUSE circuits 84a–84k are similar to the AFUSE circuits 64 of FIG. 4.

Figure 7:
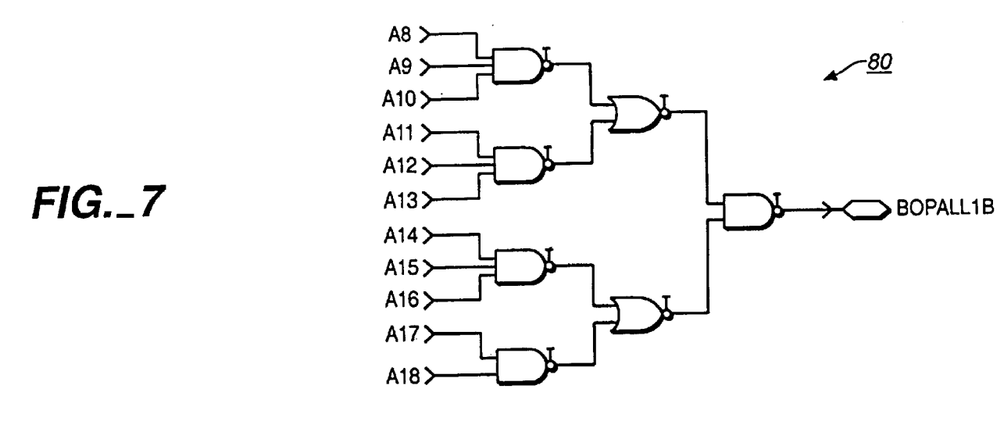
FIG. 7 is a circuit diagram of a BOTALL1 circuit that detects an all 1's address signal for the bottom set of memory address lines.

FIG. 7 illustrates a BOTALL1 circuit 88 that detects an all 1's address signal for the bottom set of memory address lines and that provides a BOTALL1B output signal.

Figure 8A:
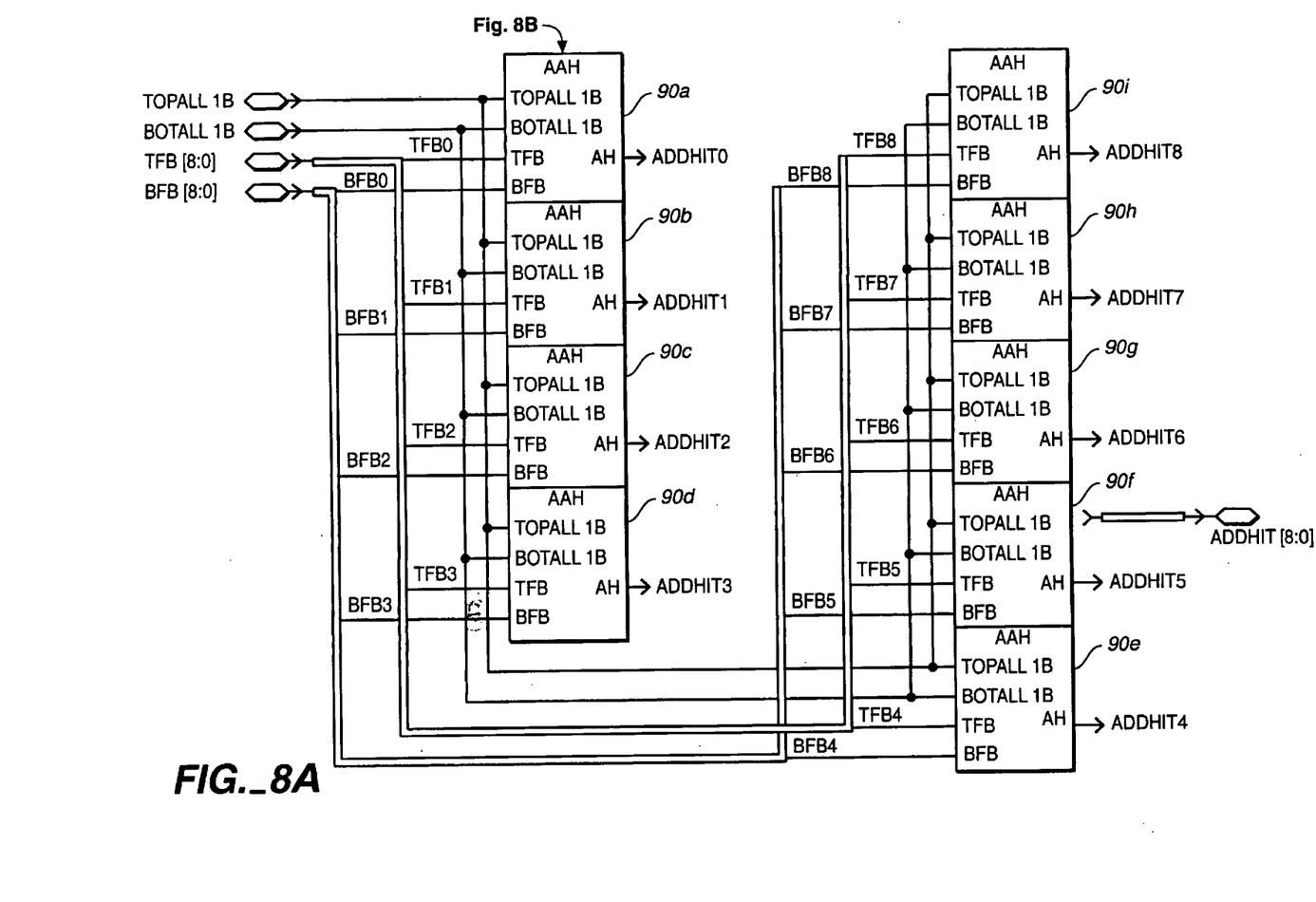
FIG. 8A is a block diagram of an ADDHIT circuit that contains nine AAH circuits for providing each one of the address hit ADDHIT[8:0] signals

FIG. 8A shows the ADDHIT circuit 24 that contains nine AAA circuits 90a–90i to provide each one of the nine address hit signals ADDHIT[8:0]

Figure 8B:
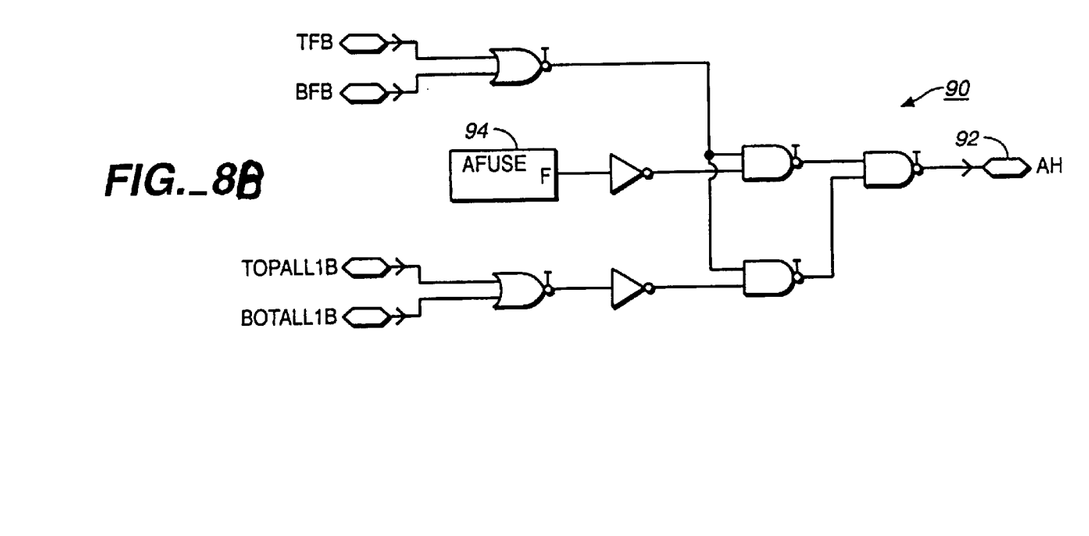
FIG. 8B is a circuit diagram of an AAH circuit.

FIG. 8B illustrates an AAH circuit 90. Nine of these AAH circuits 90 are provided in the ADDHIT circuit 24 to provide the ADDHIT[8:0] signals on bus 30 of FIG. 1. Each AAH circuit 90 combines one of the TFB, BFB, TOPALL1B, and BOTALL1B signals to provide one of the nine different address hit signals AH at an output terminal 92. An AFUSE circuit 94 is provided to provide the ADDHIT circuit 24 with information about whether the one of the ADDHIT[8:0] signals is to go active for the all ones case. The fuse inside the AFUSE circuit 94 in the ADDHIT circuit 24 is used to indicates whether or not the all ones case is to be considered as a defective address or not. If that fuse is not blown, the output signals TOPALL1B on a signal line 32 and a BOTALL1B on a signal line 34 are ignored by the logic circuits of the ADDHIT circuit 24.

Figure 9:
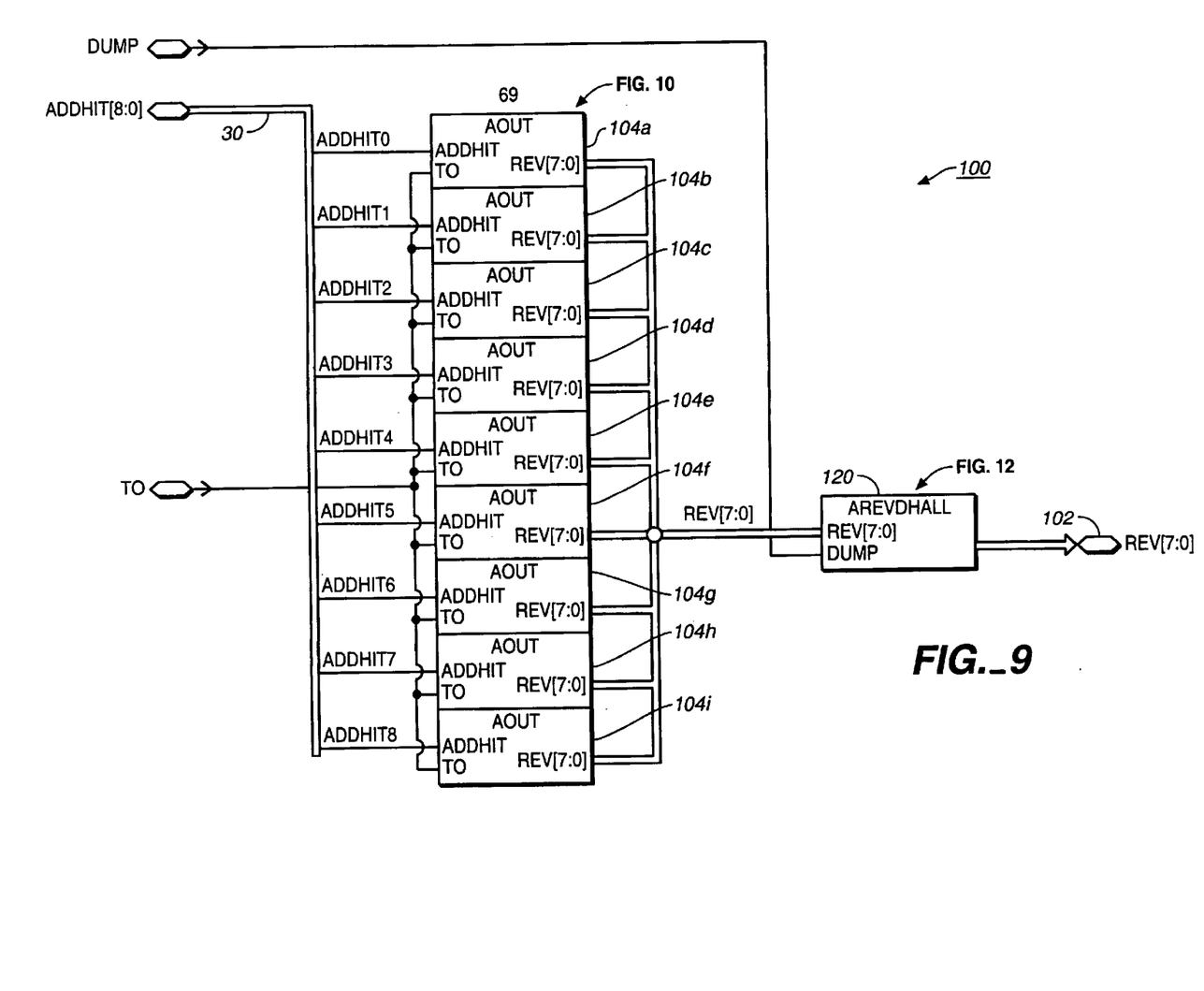
FIG. 9 is a block diagram of an AOUTALL circuit that provides eight reversing signals REV[7:0], each of which is used to reverse the output polarity of a selected one of the output signals for a defective ROM cell.

FIG. 9 illustrates an AOUTALL circuit 100 that provides eight reversing signals REV[7:0] at its output terminals 102. The REV[7:0] signals are used to reverse polarity of one of the output signals from a defective ROM cell. Each of the nine ADDHIT[8:0] signals on the bus 30 are provided to an input terminal of one of nine AOUT circuits 104a–104i. The clock signal TO is provided to all of the nine AOUT circuits 104a–104i. Each of the AOUT circuits 104a–104i takes one of the ADDHIT[8:0] signals and creates one of the REV [7:0] signals on the rising edge of the clock signal TO. The signal TO is slightly delayed to prevent one of the REV[7:0] signals from going high until an information signal INTDB [7:0] from a defective cell is established to prevent the signal on a ROM output pin from switching unnecessarily.

Figure 10:
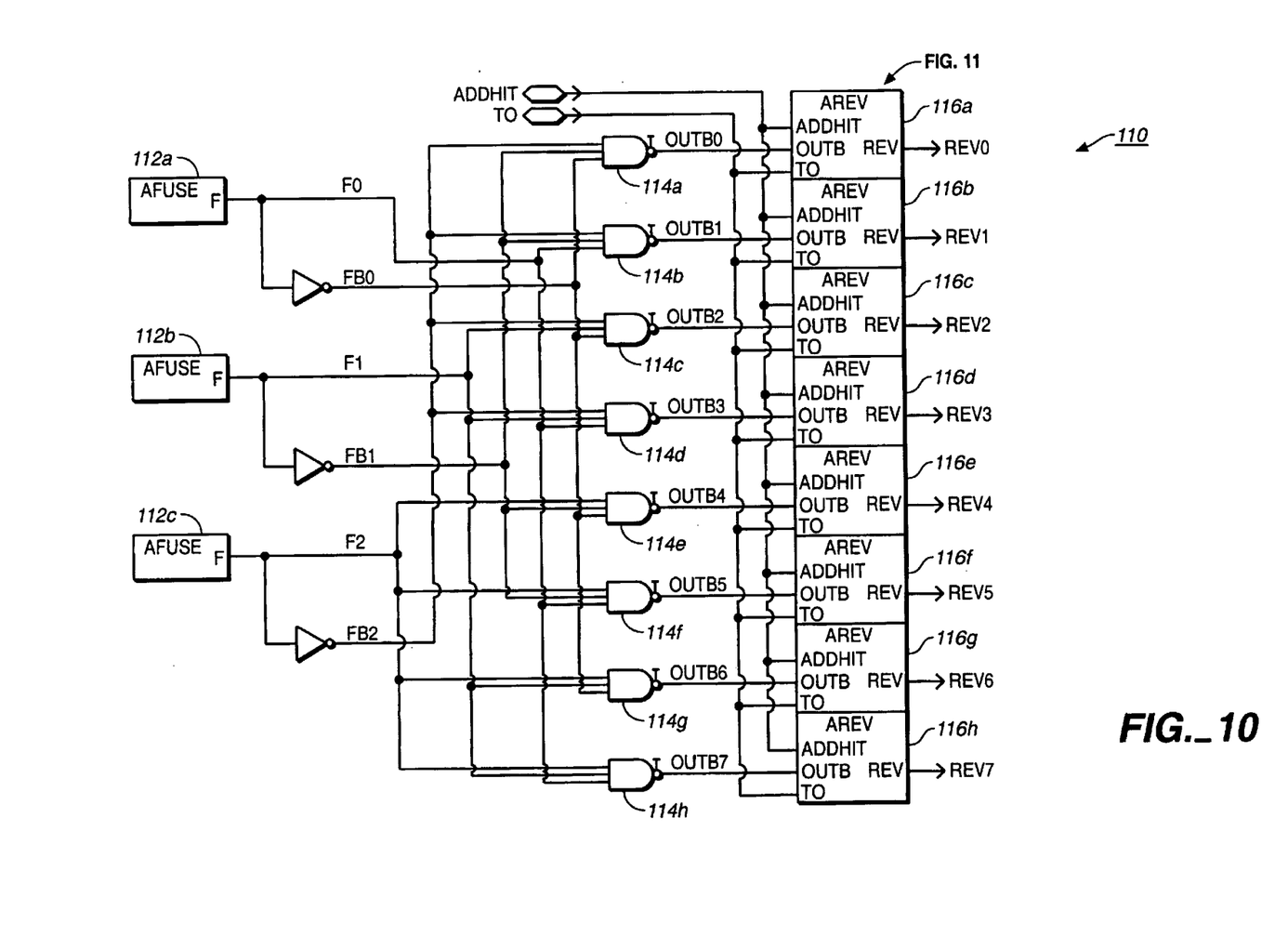
FIG. 10 is a block diagram of one of nine AOUT circuits that are used in the AOUTALL circuit of FIG. 9.

FIG. 10 illustrates an AOUT circuit 110 that is the same as the nine AOUT circuits 104a–104i used in the AOUTALL circuit 36 of FIG. 1A. The AOUT circuit 110 uses an array of three AFUSE circuits. 112a–112c to direct a particular one of the ADDHIT signals to a particular one of the eight REV[7:0]signal terminals. The AFUSE circuits have static output signals F0–F2 and inverted output signal FB0–FB2 that are decoded with eight NAND gates 114a–114h to provide one of eight output bit select signals OUTB1–OUTB7.

Each of the terminals for the eight output bit select signals OUTB1–OUTB7 is connected to an input terminals of one of eight AREV circuits 116a–116h. One of the ADDHIT signals is also connected to an input terminal of each one of the eight AREV circuits 116a–116h. The TO signal is also connected to an input terminal for each one of the eight AREV circuits 116a–116h.

Figure 11:
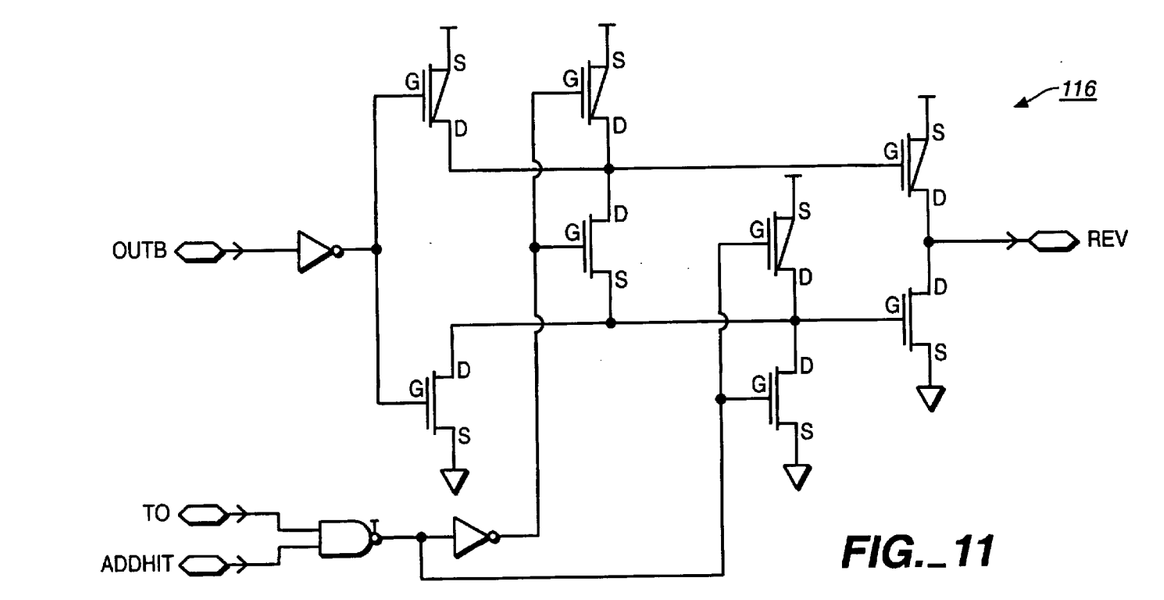
FIG. 11 is a circuit diagram of one of nine tri-state buffer circuits AREV that provides a tri-state output signal for each of the REV[8:0]signals from the AOUT circuit.

FIG. 11 illustrates an AREV circuit 116 which is a tri-state buffer circuit that provide an output signal REV that is not active unless OUTB is low, ADDHIT is high, and the clock signal TO goes high. If either TO or ADDHIT is low, REV is tri-stated and the output signal REV not driven by the AREV circuit 116. A tri-state circuit has normal high and low output logic states that have normal output impedance. A third state has a tri-state output impedance that is very high.

Figure 12:
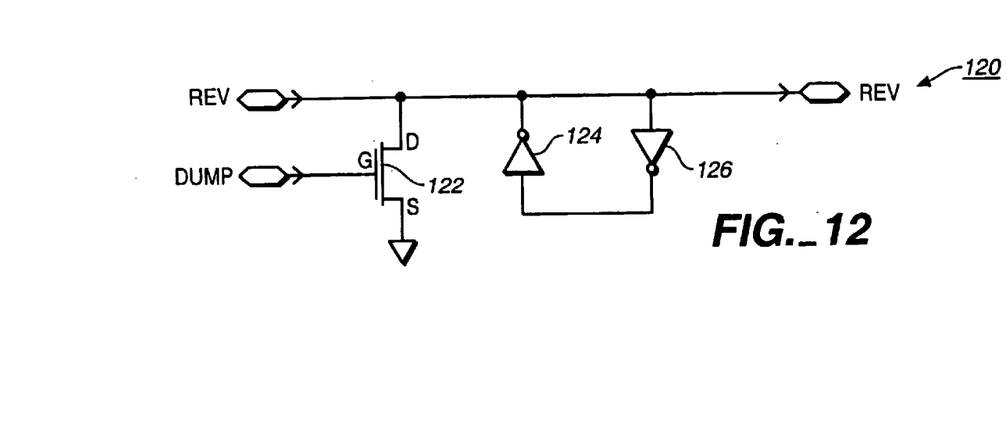
FIG. 12 is a circuit diagram of a REVDH circuit that is triggered by a DUMP signal to bring down a previous REV signal and that also contains a high impedance holding latch for the case where the circuit of FIG. 11 tri-states a REV output signal.

FIG. 12 illustrates a REVDH circuit. FIG. 9, shows an AREVDHALL circuit 120 that includes eight REVDH circuits. Each of the REVDH circuits 120 is a high impedance latch circuit which holds a signal level when an AREV circuit is in a high impedance tri-state condition. Each of the REVDH circuits 120 is connected to a tri-state output terminal of one of the AREV circuits 116 of one of the AOUT circuits 104a–104i of FIG. 9. Each of the REVDH circuits contains a dump transistor 122 that is triggered by a DUMP signal to brings down a previously set REV signal.

Referring to back FIG. 1B, four of eight output amplifier chains are shown for driving respective data output DOUT [7:0] PADS 60a, 60b, 60c, 60d of the ROM chip. Each of the output amplifier chains includes a data output buffer DOBUF circuit 56a, 56b, 56c, 56d that drives a respective IODRIVER circuit 58a, 58b, 58c, 58d. Each data output buffer DOBUF circuit has the capability of reversing the sense of an output bit from a defective ROM cell.

Figure 13A:
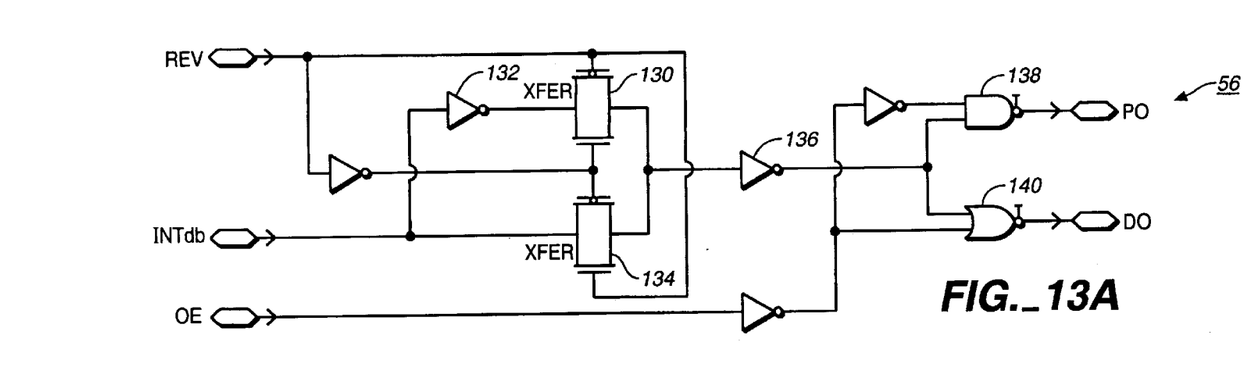
FIGS. 13A B, C are circuit diagrams of various circuits used with a data output buffer DOBUF circuit

FIG. 13A illustrates a DOBUF circuit 56 of FIG. 1B. The DOBUF circuit 56 receives an internal data bus signal INTDB from one of the sense amplifiers of the memory array when the REV signal is inactive, or low, a transfer gate 130 passes an inverted INTDB signal from an inverter 132. When the REV signal is active, or high, a transfer gate 134 passes an INTdb signal from a normal memory cell. The signal path through the inverter 132 is removed when REV is high. The output signal of the transfer gates 130, 134 is inverted by an inverter 136 and provided to an input terminal of a 2-input NAND gate 138 and to an input terminal of a 2-input NOR gate 140. The other input terminal of the NAND gate 138 receives the output enable OE signal. The NAND gate 138 provides a pull-up PO signal at its output terminal. The other input terminal of the NOR gate 140 receives an inverted output enable OE signal. The NOR gate 140 provides a pull-down DO signal at its output terminal. Both PO and DO have the same polarity when OE is active.

Figure 13B:
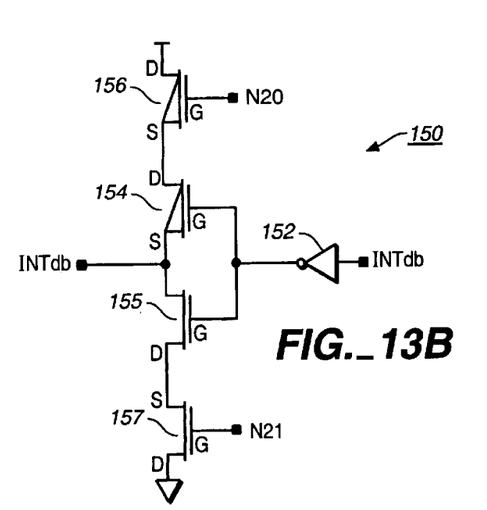

FIG. 13B illustrates a low impedance buss holding latch circuit 150 that receives an INTdb signal from a ROM sense amplifier circuit and that provides an output signal to the INTdb input terminal of the DOBUF circuit of FIG. 13A. The low impedance buss holding latch circuit 150 receives a positive control pulse signal OEPULS that tri-states the low impedance buss holding latch circuit 150. The low impedance buss holding latch circuit 150 includes an inverter stage 152 having an input terminal receiving the INTdb signal from the ROM sense amplifier and an output terminal connected in common to the gates of a first PMOS transistor 154 and a first NMOS transistor 155, both of which have their sources connected in common to an output terminal that is connected to the INTdb input terminal of FIG. 13A. A second PMOS transistor 156 is connected in series to the first PMOS transistor 154 and has a gate terminal N20. A second NMOS transistor 157 is connected in series with the first NMOS transistor 155 and has a gate terminal N21.

Figure 13C:
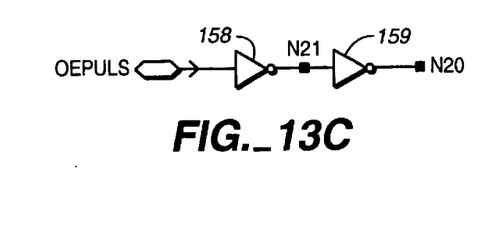

FIG. 13C shows an OEPULS signal that comes from the CLOCKS circuit of FIG. 1A and that is inverted by a first inverter to drive gate terminal N21 and that is again inverted by an inverter 159 to drive gate terminal N20. The purpose of the OEPULS signal is to momentarily tri-state the low impedance buss holding latch circuit 150 so that the ROM output pad does not change state until the information on INTDB is finalized. The OEPULS signal also momentarily notches, or brings low, the OE signal to achieve the same result.

Figure 14:
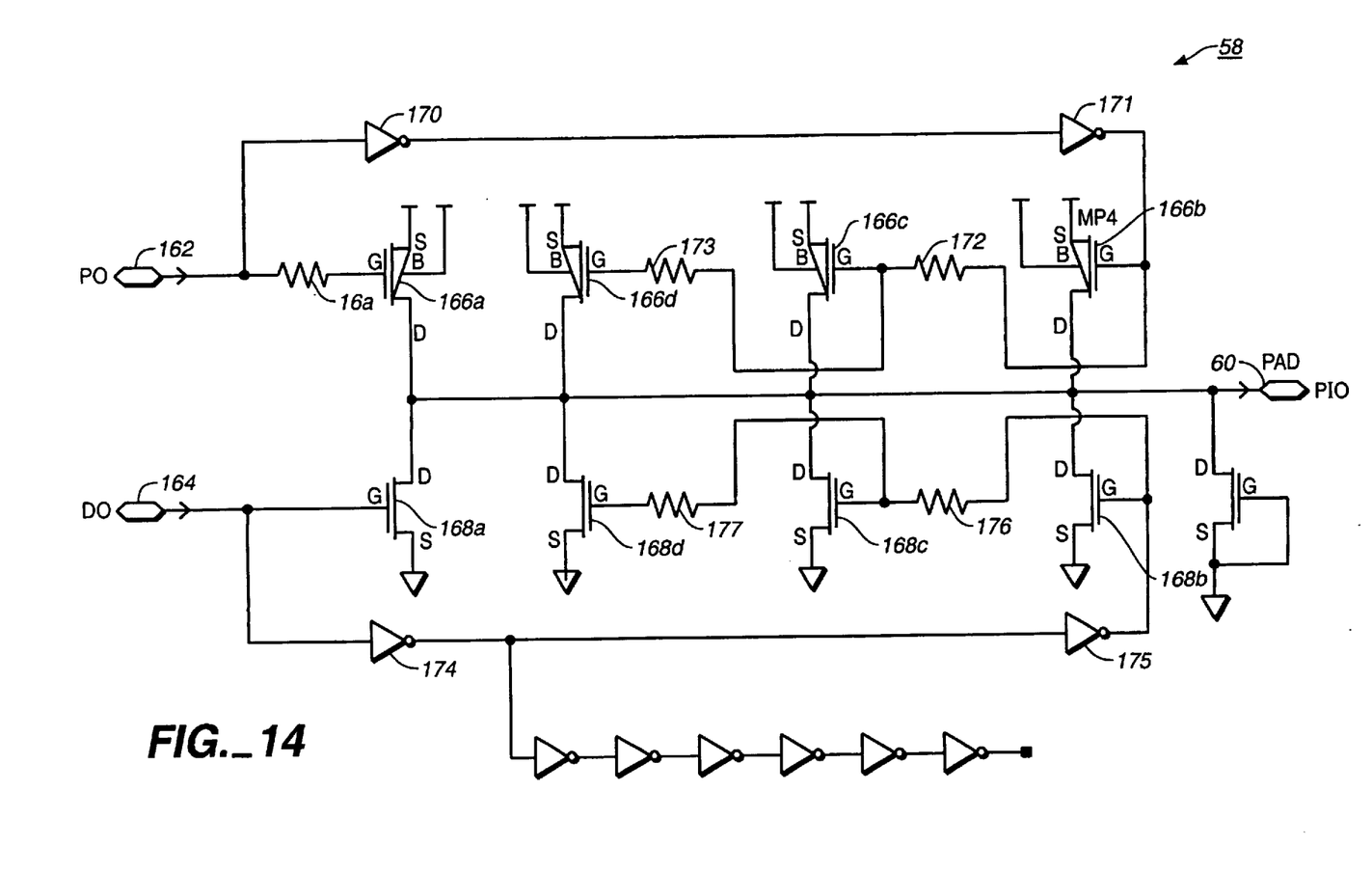
FIG. 14 is a block diagram of an output driver AIO-DRIVER circuit that drives one of eight output pads of a ROM chip.

FIG. 14 illustrates an output driver AIODRIVER circuit 58 that is a multistage inverter circuit that provides smooth transitions for a PIO signal at an output pad, 60. The pull-up PO signal drives an input terminal 162 and the pull-down DO signal drives an input terminal 164. The AIODRIVER circuit 58 has four PMOS transistors 166a, 166b, 166c, 166d that are connected in parallel between a VCC voltage source and the PIO output terminal 60. These PMOS transistors are controlled by the pull-up PO signal and function as parallel current sources for the PIO output pad. The AIODRIVER circuit 58 also has four NMOS transistors 168a, 168b, 168c, 168d that are connected between the PIO output terminal 60 and a VSS ground. These NMOS transistors function as parallel current sinks for the output pad 60 and are controlled by the pull-down DO signal. Both the PO and the DO signal have the same polarity when OE is active. When both of these signals are 1's, PIO becomes a 0. When both of these signals are 0's, PIO becomes a 1.

The pull-up signal PO passes through a series resistor 169 to a gate terminal of the PMOS transistor 166a. The pull-up signal PO is also successively propagated through a serially connected delay-line type of circuit that includes a pair of inverters 170, 17i that are in series with two resistors 172, 173 and the respective gate input capacitances of the PMOS source transistors 166b, 166c, 166d. This arrangement causes the pull-up PO signal to be delayed as it propagates to the various PMOS transistors so PIO signal transitions are smooth without excessive power supply and ground current surges.

In a similar manner, the pull-down signal DO is connected to a gate terminal of the NMOS transistor 168a. The pull-down signal DO is also successively propagated through another serially connected delay-line type of circuit that includes a pair of inverters 174, 175 that are in series with two resistors 176, 177 and the respective gate input capacitances of the NMOS sink transistors 168b, 168c, 168d. This arrangement causes the pull-down DO signal to be delayed as it propagates to the various NMOS transistors so PIO signal transitions are also smooth without excessive ground current surges.

FIG. 15 illustrates a timing chart that shows examples of various timing waveforms for a number of signals in the ROM error control correction system of FIGS. 1A and 1B using a horizontal time scale with 5 nanosecond intervals. The signal waveforms are for signals that are described in connection with FIGS. 1A and 1B, unless otherwise indicated. For this timing chart, the fuse 94 in FIG. 8 is blown so that a defective all 1's memory cell is to be reversed.

The ADDRESS[18:0] signal represents a special case of all of the eighteen address signals for the ROM chip going to 1's. Usually the address signals will be a mixture of 1's and 0's. The leading edge of the input ADDDRESS[18:0] signals transition from the 0 state to a 1 state.

Beginning at the left hand side of the timing chart, after all of the eighteen input addresses ADDRESS[18:0] transition to all 1's, the TOPALL1B signal from the TOPALL1 circuit 26 transitions from a 1 to an active 0 state, indicating that the top eight address signals are all 1's. The TOPECC circuit 16 provides an output transition in the TFBO signal from a 1 to a 0 level, indicating that an all 1's codeword for the top eight address lines was matched in the TOPECC circuit.

Similarly, the BOTALL1B signal from the BOTALL1 circuit 28 transitions from a 1 to an active 0 state, indicating that the bottom eleven address signals are all 1's. The BOTECC circuit 20 provides an output transition in the TFB0, signal from a 1 to a 0 level, indicating that an all 1's codeword for the bottom address lines was matched in the BOTECC circuit 20.

The ADDHIT0 signal then transitions from a 0 to an active 1 level, indicating that all of the high and low address components of an input address for a defective cell has been recognized.

Edge detector circuits operate on all of the input address input signals to provide a falling edge for the STARTB signal. The edge transitions of the input address signals generate the STARTB pulse signal, which then generates the TO pulse signal and the DUMP pulse. The AOUTALL cell 36 takes the ADDHIT signal and creates one of the REV [7:0] signals on the rising edge of a signal TO. The transition of the TO signal to a 1 level produces the REV0 signal, which reverses the INTdb0 signal. The CLOCKS circuit 42 also provides a DUMP signal on a signal line 46. The DUMP signal remove a previously active REV[7:0] signal held in the AOUTALL circuit 36 from a previous memory operation cycle. The signal TO is slightly delayed to prevent one of the REV[7:0]signals from going high until an information signal INTDB from a defective cell is established. This prevents the signal on a ROM output pin from switching around unnecessarily.

The PO and DO signals are initially shown as 0 levels and the PIO signal is initially shown at the inverse 1 level. PIO is tri-stated during the active (0) level of the OE signal. Assuming that the memory cell for the all 1's address is initially at a 0 level, the system keeps both P0 and Do low to provide a corrected 1 level for PIO using the REV0 signal. Assuming that the second set of transactions in the Address Signals of FIG. 15 provides address signals that do not address a defective ROM cell, the TOPALL1B, TFB0, BOTall1B, and the BFB0 signals all go to inactive 1 levels. This causes the ADDHIT0 signal to go to an inactive 0 level and subsequently the REV0 signal to go to an inactive 0 level.

The DOBUF0 circuit 56a of FIG. 13 produces the pull-up PO and the pull-down DO signals that are input signals to the IODRIVER0 58 of FIG. 14. The output signal of the IODRIVER 58 is the PIO signal.

To provide correction for each one of nine defective bits in the 4 Mbit ROM, which is used in connection with the present invention, requires a total of 23 fuses per bit. The average number of fuses blown per bit is 11.5.

The foregoing, descriptions of on e specific embodiment of the present invention have been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A fuse-controlled error-correction control system for a ROM, comprising:
    a defective memory-cell address detector circuit (CMP) that compares input address signals for the ROM to a fuse-controlled preset static address of a predetermined defective memory cell of the ROM and that provides an address-hit output signal (ADDHIT), which indicates the occurrence of input address signals corresponding to said fuse-controlled preset static address of said predetermined defective memory cell;
    an (AOUT) circuit that receives the address-hit output signal ADDHIT signal and that provides a corresponding bit-reversal output signal (REV); and
    a data output buffer that receives data bits from memory cells of the ROM, including a bit from said predetermined defective memory cell, and that has an output terminal coupled to a data output terminal of the ROM, said data output buffer having an output-reversal control terminal for receiving the bit-reversal output signal REV, which reverses the sense of the data signal corresponding to the predetermined defective memory cell at the output terminal of the data output buffer when the address of the defective memory cell is detected by the defective memory-cell address detector circuit CMP.

2. The fuse-controlled error-correction control system of claim 1 wherein the defective memory cell address detector circuit CMP includes a comparator circuit that compares each bit of a multi-bit memory address signal to respective fuse-controlled static bits in an array of fused circuits that statically represent an address of the predetermined defective memory cell.

3. The fuse-controlled error-correction control system of claim 2 wherein the comparator circuit uses exclusive logic (ADDXNOR) to compare individual bits of the multi-bit memory address signals to respective fuse-controlled static bits that represent an address of a defective memory cell.

4. The fuse-controlled error-correction control system of claim 2 wherein the fuse-controlled static bits for the address for the defective memory cell are provided by an array of fuses that are adapted to be blown by a laser beam.

5. The fuse-controlled error-correction control system of claim 1
    wherein the ROM includes a plurality of data output buffers; and
    wherein the (AOUT) circuit that receives the address-hit output signal ADDHIT signal and that provides a corresponding bit-reversal output signal (REV) includes a fuse-controlled error-correction control system for selecting a particular one of said plurality of data output buffers.

6. The fuse-controlled error-correction control system of claim 1 including a circuit for recognizing an all 1's input address signal as an address for a defective memory cell.

7. The fuse-controlled error-correction control system of claim 1 including an other defective memory-cell address detector circuit that compares input address signals for the ROM to an other fuse-controlled preset static address of an other predetermined defective memory cell of the ROM and that provides an other address-hit output signal (ADDHIT), which indicates the occurrence of the other input address signals corresponding to said fuse-controlled preset static address of said other predetermined defective memory cell.

8. A fuse-controlled error-correction control system for a ROM, comprising:
    a defective memory-cell address detector circuit (CMP) that compares input address signals for the ROM to a plurality of fuse-controlled preset static addresses of a predetermined corresponding plurality of defective memory cells of the ROM and that provides a plurality of corresponding address-hit output signals (ADDHIT), which indicate the occurrence of one of the input address signals corresponding to one of the fuse-controlled preset static addresses of one of the predetermined defective memory cells;

an (AOUT) circuit that receives the address-hit output signals ADDHIT signal and that provides a corresponding bit-reversal output signal (REV) for each defective memory cell; and a plurality of data output buffers that receives data bits from memory cells of the ROM, including bits from said predetermined defective memory cells, each of said plurality of data output buffers having an output terminal coupled to a data output terminal of the ROM, each of said data output buffers having an output-reversal control terminal for receiving one of the bit-reversal output signals REV that reverses the sense of the data signal corresponding to one of the predetermined defective memory cell at the output terminal of the data output buffer when the address of one of the defective memory cell is detected by the defective memory-cell address detector circuit CMP.

9. The fuse-controlled error-correction control system of claim 8 wherein the defective memory cell address detector circuit CMP includes a plurality of comparator circuits that compares each bit of a multi-bit memory address signal to respective fuse-controlled static bits in an array of fused circuits that statically represent addresses of the predetermined defective memory cells.

10. The fuse-controlled error-correction control system of claim 9 wherein the fuse-controlled static bits for the addresses for the defective memory cells are provided by an array of fuses that are adapted to be blown by a laser beam.

11. The fuse-controlled error-correction control system of claim 8, wherein the comparator circuit uses exclusive logic (ADDXNOR) to compare individual bits of the multi-bit memory address signals to respective fuse-controlled static bits that represent the address of the defective memory cells.

12. The fuse-controlled error-correction control system of claim 8, wherein the ROM includes a plurality of data output buffers; and wherein the (AOUT) circuit that receives the address-hit output signal ADDHIT signals and that provides corresponding bit-reversal output signals (REV) includes a fuse-controlled error-correction control system for selecting a particular one of said plurality of data output buffers.

13. A method of controlling error-correction for a ROM, comprising the steps of:

comparing input address signals for the ROM to a fuse-controlled preset static address of a predetermined defective memory cell of the ROM;

providing an address-hit output signal (ADDHIT), which indicates the occurrence of input address signals corresponding to said fuse-controlled preset static address of said predetermined defective memory cell;

providing a corresponding bit-reversal output signal (REV) in response to the address-hit output signal ADDHIT;

in response to the bit-reversal output signal (REV), reversing the sense of the data signal corresponding to the predetermined defective memory cell at the output terminal of a data output buffer when the address of the defective memory cell is detected by the defective memory-cell address detector circuit CMP.

14. The method of claim 13 wherein the step of comparing input address signals for the ROM to a fuse-controlled preset static address of a predetermined defective memory cell of the ROM includes comparing each bit of a multi-bit memory address signal to respective fuse-controlled static bits in an array of fused circuits that statically represent an address of the predetermined defective memory cell.

15. The method of claim 14 wherein the step comparing includes using exclusive logic (ADDXNOR) to compare individual bits of the multi-bit memory address signals to respective fuse-controlled static bits that represent an address of a defective memory cell.

16. The method of claim 14 wherein the step of comparing includes providing the fuse-controlled static bits for the address for the defective memory cell with an array of fuses that are adapted to be blown by a laser beam.

17. The method of claim 13 includes providing a plurality of data output buffers; and selecting a particular one of said plurality of data output buffers for receiving the address-hit output signal ADDHIT signal that provides a corresponding bit-reversal output signal (REV) includes controlling said selection with a fuse-controlled error-correction control system.

18. The method of claim 13 including the step of recognizing an all 1's input address signal as an address for a defective memory cell.

19. The method of claim 13 including comparing input address signals for the ROM to an other fuse-controlled preset static address of an other predetermined defective memory cell of the ROM; and providing an other address-hit output signal (ADDHIT), which indicates the occurrence of the other input address signals corresponding to said fuse-controlled preset static address of said other predetermined defective memory cell.

* * * * *